(12) United States Patent
Nicollini et al.

(10) Patent No.: US 6,201,438 B1
(45) Date of Patent: *Mar. 13, 2001

(54) AREA-EFFICIENT RECONSTRUCTION FILTERS, PARTICULARLY FOR D/A CURRENT-DRIVEN CONVERTERS

(75) Inventors: Germano Nicollini, Piacenza; Pierangelo Confalonieri, Canonica D'Adda, both of (IT)

(73) Assignee: STMicroelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/129,450

(22) Filed: Aug. 4, 1998

(30) Foreign Application Priority Data

Aug. 29, 1997 (EP) .................................................. 97830429

(51) Int. Cl.[7] ...................................................... H03K 5/00
(52) U.S. Cl. ............................ 327/558; 327/552; 327/344
(58) Field of Search .................................... 327/552, 558, 327/344; 330/107, 305, 109; 333/172

(56) References Cited

U.S. PATENT DOCUMENTS

| | | | |
|---|---|---|---|
| 4,275,453 | * 6/1981 | Wagner | ................................. 327/558 |
| 5,014,304 | * 5/1991 | Nicollinit et al. | .................... 327/558 |
| 5,412,335 | 5/1995 | Jackson et al. | ....................... 327/552 |

OTHER PUBLICATIONS

European Search Report from European Patent Application 97830429.3, filed Aug. 29, 1997.

J. Whitmore: "Digital–To–Analog Converter Controls Active Filter" Electronics, DE 1984 A 1985; Electronics Week., vol. 48, No. 2, Jan. 23, 1975, New York US, p. 86.

* cited by examiner

*Primary Examiner*—Dinh T. Le
(74) *Attorney, Agent, or Firm*—Wolf, Greenfield & Sacks, P.C.; James H. Morris; Theodore E. Galanthay

(57) ABSTRACT

An area-efficient low-pass, time-invariant, second-order reconstruction filter, particularly for current-driven digital-to-analog converters, including: a first resistor and a first capacitor which are parallel connected; an operational amplifier; a terminal of a second resistor which is connected to the inverting input of the operational amplifier; another terminal of the second resistor which is connected to a common node of the first resistor and the first capacitor; a second capacitor, which is ffeedback-connected between the output of the operational amplifier and the inverting input; and an additional pair of resistors which are arranged so as to provide feedback between the output and the inverting input, a current signal arriving from a digital-to-analog converter arranged upstream of the reconstruction filter being fed to a common node of the additional pair of resistors.

27 Claims, 3 Drawing Sheets

AREA-EFFICIENT RECONSTRUCTION FILTERS, PARTICULARLY FOR D/A CURRENT-DRIVEN CONVERTERS

BACKGROUND OF THE INVENTION

1. Field of the Invention

The present invention relates to area-efficient reconstruction filters, particularly for current-driven digital-to-analog converters (DAC).

2. Discussion of the Related Art

Digital-to-analog converters are conventionally used very frequently in integrated circuits.

Since these converters are sampled-data circuits, in addition to generating the intended analog signal in the correct frequency range or base band, they also produce an undesirable duplicate image of the signal, generally designated as "imaging", as shown in FIG. 1, which plots the output of the DAC as a function of the frequency f.

The chart shows that in addition to the output signal, designated by S (where B is the base band), there is also a duplicate image of the signal S which is centered around the sampling frequency $f_s$ of the DAC.

In order to eliminate this duplicate image, a continuous-time low-pass reconstruction filter is usually introduced and placed downstream of the DAC, as shown in FIG. 2.

In this figure, the reference numeral 1 designates an N-bit DAC, where $b_0, b_1, \ldots b_{n-1}$ are the input bits of the DAC and $V_{DAC}$ and $I_{DAC}$ are, respectively, the output voltage and the output current of the DAC; the reference numeral 2 instead designates a continuous-time low-pass reconstruction filter arranged downstream of the DAC; $V_o$ is the output voltage.

The reconstruction filter 2 must provide high attenuation for frequencies close to the sampling frequency $f_s$ of the DAC, but at the same time it must be efficient in terms of area occupation if the DAC is to be used in an integrated circuit, where of course the requirement of minimum area occupation is one of the most important factors.

It is known to those skilled in the art that these are two mutually contrasting requirements.

It is therefore necessary to achieve a compromise, shown in FIGS. 3a and 3b. The filters shown in these figures are second-order low-pass filters. The solution shown in FIG. 3b, however, is the one that is practically mandatory when working with supply voltages of less than 3V.

This solution is rather area-efficient when the input signal is a voltage, but it is highly insufficient when the input signal must be a current, as shown in FIG. 3c by applying only the Norton equivalent to the input of FIG. 3b.

A numeric example is now described to clarify the above explanation.

Assume that a DAC has been devised which has a full-scale voltage output $V_{iFS}$ and that a full-scale voltage from the reconstruction filter is required as output. Assume also that a cutoff frequency of approximately 270 kHz is chosen for the filter.

The values of the components of FIG. 3b will be as follows:

$$R_1=R_2=R_3=50 \text{ kohm } C_1=25.2 \text{ pF } C_2=5.6 \text{ pF}$$

Assume also that one intends to use a DAC with a full-scale current output $I_{DACFS}=160 \mu A$ and that one seeks a full-scale output voltage $V_{OFS}=0.5$ V from the reconstruction filter with a frequency response which is identical to that of the filter used previously with the voltage-output DAC.

Since one must have $R_3 I_{DACFS}=V_{OFS}$, then $R_3=3.125$ kohm and therefore $R_1=R_2=R_3=3.125$ kohm.

Therefore, in order to have the same frequency response as the preceding filter, the values of $C_1$ and $C_2$ must be 403.2 pF and 89.6 pF respectively.

Accordingly, the area occupied on the silicon in order to integrate the values of these components is approximately sixteen times greater than the area occupied to integrate the components of FIG. 3b, due to the relatively low specific capacitance that can be provide in integrated circuits.

Therefore, the reconstruction filter, in the case of a current input (and therefore of a current output of the DAC), is very wasteful from the point of view of the area occupied on the silicon wafer.

SUMMARY OF THE INVENTION

An aim of the present invention is to provide an area-efficient reconstruction filter, particularly for current-driven digital-to-analog converters.

Within the scope of this aim, an object of the present invention is to provide a reconstruction filter for current-driven digital-to-analog converters which is optimized in view of its integration in integrated circuit.

Another object of the present invention is to provide a reconstruction filter for current-driven digital-to-analog converters in which the reconstruction filter with a current input occupies the same area as the corresponding reconstruction filter with a voltage input.

Another object of the present invention is to provide a reconstruction filter with a current input having the same transfer function as a similar reconstruction filter with a voltage input.

Another object of the present invention is to provide a reconstruction filter which is highly reliable, relatively easy to produce and at competitive costs.

This aim, these objects and others which will become apparent hereinafter are achieved by an area-efficient low-pass, time-invariant, second-order reconstruction filter, particularly for current-driven digital-to-analog converters, comprising: a first resistor and a first capacitor which are parallel connected; an operational amplifier; a terminal of a second resistor which is connected to the inverting input of said operational amplifier; another terminal of said second resistor which is connected to a common node of said first resistor and said first capacitor; a second capacitor, which is feedback-connected between the output of said operational amplifier and said inverting input; and an additional pair of resistors which are arranged so as to provide feedback between said output and said inverting input, a current signal arriving from a digital-to-analog converter arranged upstream of said reconstruction filter being fed to a common node of said additional pair of resistor.

BRIEF DESCRIPTION OF THE DRAWINGS

Further characteristics and advantages of the present invention will become apparent from the description of a preferred but not exclusive embodiment of the reconstruction filter according to the invention, illustrated only by way of non-limitative example in the accompanying drawings, wherein.

DETAILED DESCRIPTION

Figure 1:
FIG. 1 is a chart that plots the signal in output from a DAC.
Figure 2:
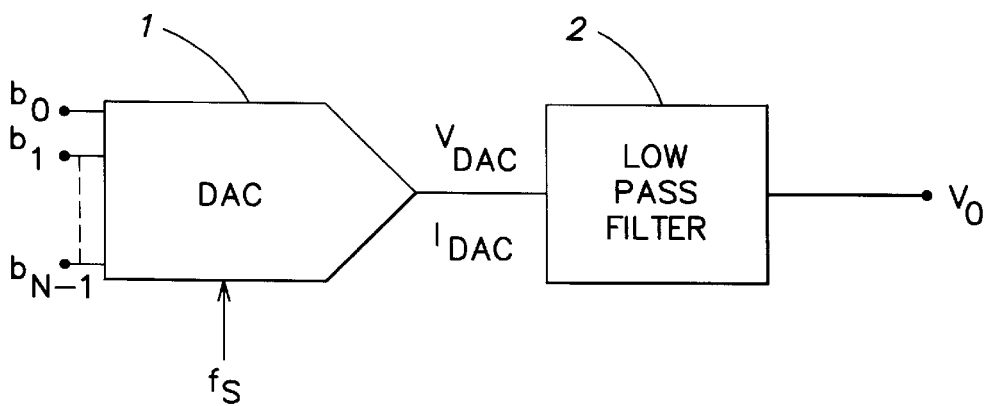
FIG. 2 is a block diagram of a DAC with a reconstruction filter arranged downstream thereof.

With reference to the above figures, FIGS. 1 to 3c are not described further herein, since reference has already been made thereto in the description of the prior art and of the problems related thereto.

In the various figures, identical reference numerals and letters designate identical elements.

Figure 3A:
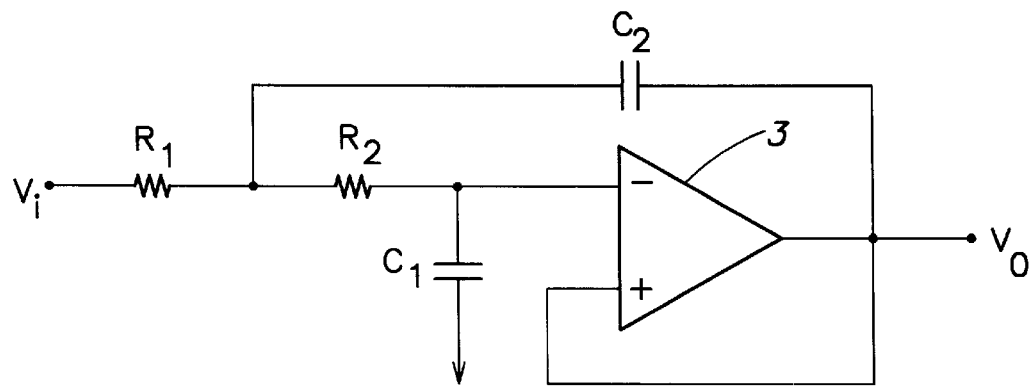
FIGS. 3a and 3b are circuit diagrams of conventional low-pass, continuous-time, second-order, voltage-input reconstruction filters used downstream of the DACs, as shown in figure 2.
Figure 3B:
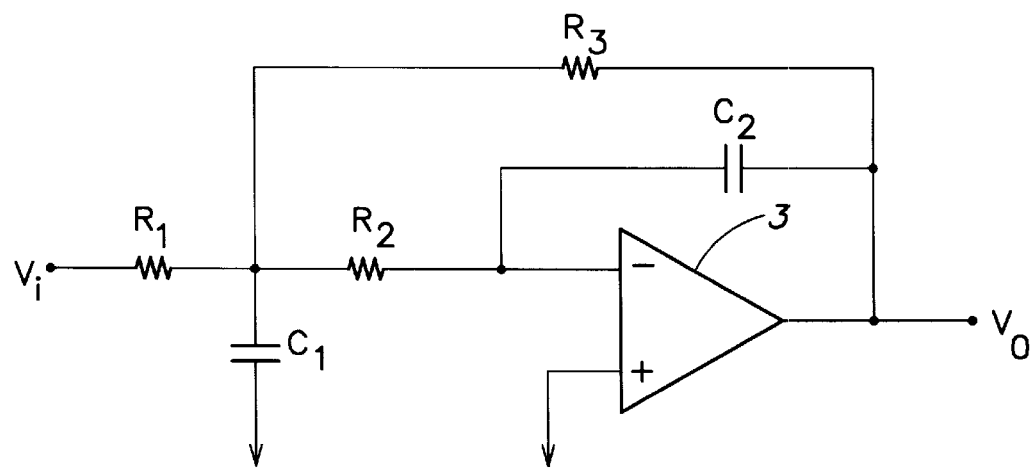
Figure 3C:
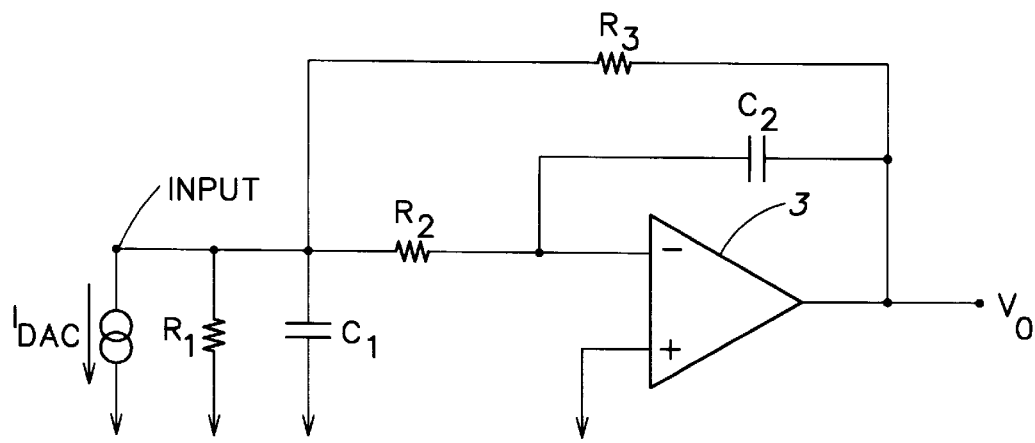
FIG. 3c is a circuit diagram of a conventional low-pass, continuous-time, second-order current-input reconstruction filter, conceptually similar to the filter shown in FIG. 3b.

FIGS. 3a–3c relate to the definition of the transfer functions of said filters, which are respectively the following.

For the filter of FIG. 3a:

$$V_0(s)/V_i(s)=1/[1+sC_1(R_1+R_2)+s^2C_1C_2R_1R_2]$$

For the filter of FIG. 3b:

$$V_0(s)/V_1(s)=(R_3/R_1)/[1+sC_2(R_2+R_3+R_2R_3/R_1)+s^2C_1C_2R_2R_3]$$

And finally, for the filter of FIG. 3c:

$$V_0(s)/I_{DAC}(s)=R_3/[1+sC_2(R_2+R_3+R_2R_3/R_1)+s^2C_1C_2R_2R_3]$$

where $R_1 I_{DAC}=V_i(s)$.

Figure 4:
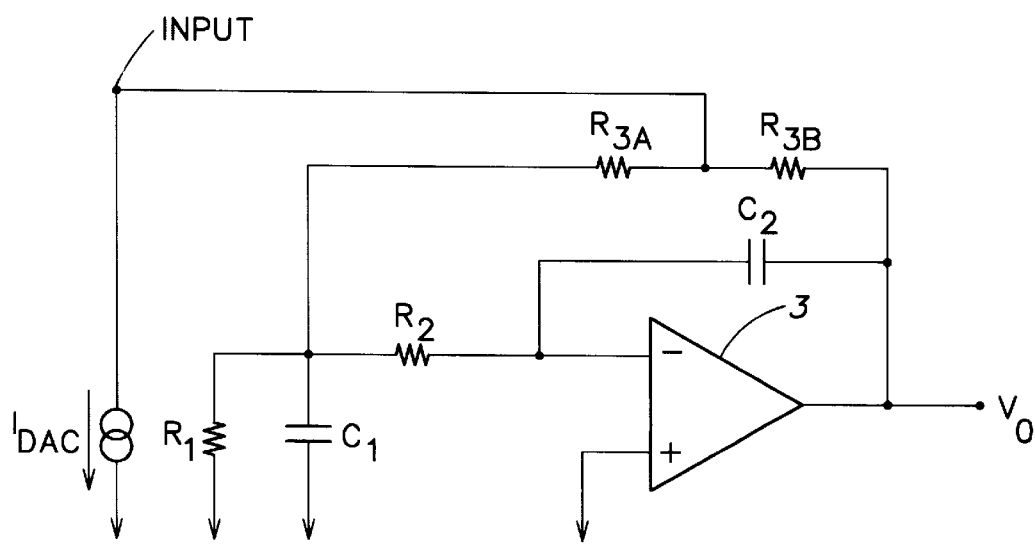
FIG. 4 is a circuit diagram of a low-pass, continuous-time, second-order current-input reconstruction filter according to the present invention.

The reconstruction filter according to the invention, shown in FIG. 4, is of the low-pass, second-order, continuous-time type and comprises an operational amplifier 3 which is advantageously provided in an inverting configuration, as in FIGS. 3a–3c, and the non-inverting input whereof is connected to the ground.

A first resistor $R_1$ is parallel-connected to a first capacitor ($C_1$) and a second resistor ($R_2$) is connected with one terminal to a common node of the first resistor and of the first capacitor and, with its other terminal, to the inverting input of the operational amplifier 3.

A second capacitor $C_2$ is feedback-connected between the output $V_o$ of the operational amplifier 3 and the inverting input, and two resistors $R_{3A}$ and $R_{3B}$ are respectively connected in parallel to said second capacitor; said resistors are arranged in series to each other, and the current $I_{DAC}$ is fed to a common node thereof. The comparison between this circuit solution (shown in figure 4) and the circuit solution of FIG. 3c shows that the resistor $R_3$ of FIG. 3c has been divided into the series of two resistors $R_{3A}$ and $R_{3B}$ (third and fourth resistors, respectively), so that the sum of these last two resistors arranged in series is equal in value to the resistor $R_3$.

The current $I_{DAC}$ enters directly the common node between the two resistors $R_{3A}$ and $R_{3A}$.

Calculation of the transfer function of the filter according to the invention shows that also in the case of a reconstruction filter with current input ($I_{DAC}$), the transfer function of the filter does not change and is always equal to that of the filter of FIG. 3b; but most of all, the area occupied is considerably smaller than that of the filter of FIG. 3c (it is in fact similar to that of the filter of FIG. 3b).

The transfer function is therefore $$V_0(s)/I_{DAC}(s)=R_{3B}/[1+sC_2(R_2+R_{3A}+R_{3B}+R_2(R_{3A}+R_{3B})/R_1)+s^2C_1C_2R_2(R_{3A}+R_{3B})]$$

where therefore $R_{3A}+R_{3B}=R_3$ and $R_{3B}I_{DAC}=V_{OFS}$.

In practice it has been observed that the reconstruction filter according to the invention fully achieves the intended aim and objects, since it allows optimization of the area occupied by the filter with a current input, in a manner similar to what occurs with a voltage-input reconstruction filter, thus allowing effective use thereof in an integrated circuit.

The reconstruction filter thus conceived is susceptible of numerous modifications and variations, all of which are within the scope of the inventive concept; all the details may also be replaced with other technically equivalent elements.

In practice, the materials employed, so long as they are compatible with the specific use, as well as the dimensions, may be any according to requirements and to the state of the art.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An area-efficient low pass, time-invariant, second-order reconstruction filter, particularly for a digital-to-analog converter, comprising: a first resistor and a first capacitor which are parallel connected between a common node and ground; an operational amplifier; a terminal of a second resistor which is connected to the inverting input of said operational amplifier; another terminal of said second resistor which is connected to said common node of said first resistor and said first capacitor; a second capacitor, which is feedback-connected between the output of said operational amplifier and said inverting input; and an additional pair of resistors which are arranged so as to provide feedback between said output and said common node of said first resistor and said first capacitor, and an input current signal arriving from said digit-to-analog converter arranged upstream of said reconstruction filter being fed to a common node of said additional pair of resistors.

2. A reconstruction filter according to claim 1, wherein said additional pair of resistors comprises a third resistor and a fourth resistor which are mutually series-connected.

3. A reconstruction filter according to claim 2, wherein the value of said four resistor multiplied by a value of said current signal is equal to an output voltage of the filter.

4. A filter circuit for receiving an input current signal from a digital-to-analog converter, said filter circuit comprising:

an amplifier having inverting and non-inverting inputs and an output;

an input R-C circuit including at least a first resistor and a first capacitor connected between a common node and ground, said common node coupled to one of said inputs of said amplifier;

a second capacitor feedback-connected between the output and the one input of the amplifier;

an additional pair of resistors disposed so as to provide feedback between the output and the common node of said input R-C circuit; and wherein said current signal from the digital-to-analog converter is fed to a common node of said additional pair of resistors.

5. A filter circuit according to claim 4 wherein said filter circuit is an area-efficient low-pass, time-invariant, second-order reconstruction filter.

6. A filter circuit according to claim 4 wherein said amplifier comprises an operational amplifier.

7. A filter circuit according to claim 4 wherein said RC circuit also includes a second resistor connected between the inverting input of the amplifier and the common node of said first resistor and said first capacitor.

8. A filter circuit according to claim 7 wherein said amplifier is an operational amplifier and said second capacitor is feedback connected between the output of the operational amplifier and the inverting input of the operational amplifier.

9. A filter circuit according to claim 8 wherein said additional pair of resistors is connected between the output of the operational amplifier and the common node of said first resistor and said first capacitor.

10. A filter circuit according to claim 4 wherein said additional pair of resistors comprises a third resistor and a forth resistor which are mutually series-connected.

11. A filter circuit according to claim 10 wherein a value of said fourth resistor multiplied by the value of the current signal is equal to an output voltage of the filter.

12. A filter circuit for receiving an input current signal from a digital-to-analog converter, said filter circuit comprising:

an amplifier having inverting and non-inverting inputs and an output;

an input R-C circuit including at least a first resistor and a first capacitor connected between a common node and ground, said common node coupled to one of said inputs of said amplifier;

a second capacitor feedback-connected between the output and the one input of the amplifier;

an additional resistance means having separate resistor values defining therebetween a common node;

said additional resistance means disposed so as to provide feedback between the output and the common node of said input R-C circuit; and wherein said current signal from the digital-to-analog converter is fed to the common node of said additional resistance means.

13. A filter circuit according to claim 12 wherein said filter circuit is an area-efficient low-pass, time-invariant, second-order reconstruction filter.

14. A filter circuit according to claim 12 wherein said amplifier comprises an operational amplifier.

15. A filter circuit according to claim 12 wherein said RC circuit also includes a second resistor connected between the inverting input of the amplifier and the common node of said first resistor and said first capacitor.

16. A filter circuit according to claim 15 wherein said amplifier is an operational amplifier and said second capacitor is feedback connected between the output of the operational amplifier and the inverting input of the operational amplifier.

17. A filter circuit according to claim 16 wherein said additional resistance means in connected between the output of the operational amplifier and the common node of said first resistor and said first capacitor.

18. A filter circuit according to claim 12 wherein said additional resistance means comprises a third resistor and a forth resistor.

19. A filter circuit according to claim 18 wherein the value of said fourth resistor multiplied by the value of the current signal is equal to an output voltage.

20. A filter circuit according to claim 12 wherein a transfer function of said filter is the same as the transfer function of reconstruction filter which is identical but has as an input a voltage signal.

21. A filter circuit for connection with a digital-to-analog converter, said filter circuit comprising:

an amplifier having a pair of inputs and an output;

an R-C circuit coupled between a common node and ground, said common node coupled to one of the inputs of said amplifier;

a pair of feedback resistors coupled in series and having a common connection node;

said feedback resistors connected between the output of said amplifier and the common node of the R-C circuit;

an input current signal coupled from the digital-to-analog converter being fed to a common connection node of the pair of feedback resistors.

22. A filter circuit according to claim 21, wherein said filter circuit is an area-efficient low-pass, time-invariant, second-order reconstruction filter.

23. A filter circuit according to claim 22, wherein said amplifier comprises operational amplifier.

24. A filter circuit according to claim 21, wherein said amplifier comprises an operational amplifier.

25. A filter circuit according to claim 21, further comprising a second resistor connected between an input of the amplifier and the common node of said first resistor and said capacitor.

26. A filter circuit according to claim 21, wherein said feedback resistors comprise a third and a fourth resistor.

27. A filter circuit according to claim 21, wherein the value of said fourth resistor multiplied by the value of said current signal is equal to an output voltage of the filter.

* * * * *